(12) United States Patent
Moriwaki

(10) Patent No.: US 7,332,420 B2
(45) Date of Patent: Feb. 19, 2008

(54) METHOD FOR MANUFACTURING SEMICONDUCTOR DEVICE

(75) Inventor: Yoshikazu Moriwaki, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 0 days.

(21) Appl. No.: 11/517,264

(22) Filed: Sep. 8, 2006

(65) Prior Publication Data

US 2007/0059909 A1    Mar. 15, 2007

(30) Foreign Application Priority Data

Sep. 15, 2005   (JP)   ............... 2005-268370
Aug. 3, 2006    (JP)   ............... 2006-211851

(51) Int. Cl.
*H01L 21/3205*   (2006.01)

(52) U.S. Cl. ............. 438/592; 438/275; 438/279; 438/655; 438/656; 438/657; 257/369; 257/413; 257/E29.156; 257/E21.622; 257/E21.623

(58) Field of Classification Search ............ 438/199, 438/279, 275, 587, 592, 652, 655, 656, 657, 438/658; 257/369, 419, E29.156, E21.622, 257/E21.623

See application file for complete search history.

(56) References Cited

U.S. PATENT DOCUMENTS 6,174,775 B1 *   1/2001   Liaw ..................... 438/283

FOREIGN PATENT DOCUMENTS

| JP | 11-261062   | 9/1999 |
| JP | 2003-229567 | 3/2003 |
| JP | 2004-134449 | 4/2004 |
| JP | 2005-229130 | 8/2005 |

* cited by examiner

*Primary Examiner*—George R. Fourson
*Assistant Examiner*—Julio J. Maldonado
(74) *Attorney, Agent, or Firm*—Young & Thompson

(57) ABSTRACT

A method for manufacturing a semiconductor device having a P-type MOSFET and an N-type MOSFET, the method comprising the steps of: forming a gate insulating film, a non-doped polysilicon film, a metal silicide film, a metal nitride film and a metal film on a semiconductor substrate; processing at least the metal film, the metal nitride film and the metal silicide film to pattern them into the shape of a gate such that the portion of the meal silicide film that forms part of a gate electrode of a P-type MOSFET and the portion of the meal silicide film that forms part of a gate electrode of an N-type MOSFET are separated from each other; introducing P-type and N-type impurities into the respective regions of the non-doped polysilicon film where the P-type and N-type MOSFETs are formed; performing thermal treatment to diffuse the impurities; and patterning the polysilicon film with the impurities introduced into the shape of the gate.

6 Claims, 5 Drawing Sheets

METHOD FOR MANUFACTURING SEMICONDUCTOR DEVICE

BACKGROUND OF THE INVENTION

1. Field of the Invention

The present invention relates to a method for manufacturing a semiconductor device, and particularly to a method for manufacturing a semiconductor integrated circuit device with a p-type MOSFET and an n-type MOSFET.

2. Description of the Related Art

In semiconductor integrated circuit devices, miniaturization of wiring is a continuing trend in increasing the integration level, and currently manufactured semiconductor integrated circuit devices include miniaturized MOSFETs (Metal Oxide Semiconductor Field Effect Transistor) with the gate length of 0.03 µm and fabricated with 0.065-µm wiring rules.

In a DRAM (Dynamic Random Access Memory), since a gate electrode is used as a wiring line, the width of the gate wiring line has the same dimension as the gate length. Therefore, reduced gate wiring resistance is necessary to satisfy both reduced voltage and increased operation speed of the DRAM. As conventional polycide wiring increases gate wiring resistance, a gate structure having a polymetal structure (hereinafter referred to as "polymetal gate") is under research and development.

Since a polymetal gate has a structure in which a refractory metal is stacked on a polysilicon film and has a low sheet resistance of about 2 Ω/□, it can be used not only as a gate electrode but also as a wiring line. Examples of refractory metal to be used includes W (tungsten) and Mo (molybdenum) that show excellent low resistivity even after a low-temperature process is carried out at 800° C. or lower as well as high tolerance to electromigration. Stacking such a refractory metal film directly on a polysilicon film may reduce adhesivity therebetween and may form a high-resistance silicide layer at the interface therebetween in a high-temperature thermal treatment process. Therefore, an actual polymetal gate has a three-layer structure in which a barrier layer formed of a metal nitride film, such as tungsten nitride ($WN_x$), is sandwiched between the polysilicon film and the refractory metal film.

The polysilicon film that forms part of the polymetal gate is doped with an impurity to reduce resistance of the polysilicon film. Directly forming the tungsten nitride film on the impurity-doped polysilicon film using PVD (Physical Vapor Deposition), such as sputtering, may increase resistance at the interface between the impurity-doped polysilicon film and the tungsten nitride film. To prevent the increase in interface resistance, in some cases, a silicide layer ($WSi_2$) as a buffer layer is formed between the impurity-doped polysilicon film and the tungsten nitride film.

On the other hand, doping an impurity into the polysilicon film has typically been carried out using a method called an NN gate process for doping phosphorus as an impurity into the polysilicon for the gates of the N-type and P-type MOSFETs.

However, for higher-speed DRAMs, it has been essential to use a method called a PN dual gate process for doping N-type and P-type impurities into the polysilicon for the gates of N-type and P-type MOSFETs, respectively, as disclosed in Japanese Patent Laid-Open No. 2005-229130, for example.

The PN dual gate process will be described in detail with reference to diagrammatic process sectional-views of FIGS. 1 and 2.

Firstly, a silicon substrate 10 is thermally oxidized to form a gate oxide film 9 with a film thickness of 3 to 6 nm. Subsequently, a non-doped polysilicon film 1 with a film thickness of 70 nm is formed on the gate oxide film (FIG. 1(a)).

Thereafter, a photoresist film 7 is formed and typical photolithography is used to remove the photoresist film 7 from an N-type gate region 6(a), where an N-type MOSFET is later formed. Then, only the N-type gate region 6(a) is implanted with P (phosphorous) ions at an acceleration voltage of 10 keV and a dose of $6.0 \times 10^{15}$ ions/cm² by ion implantation to convert the non-doped polysilicon film 1 in the N-type gate region 6(a) into an N-doped polysilicon 8(a) doped with the N-type impurity (FIG. 1(b)).

Similarly, a photoresist film 7 is formed and typical photolithography is used to remove the photoresist film 7 from the P-type gate region 6(b), where a P-type MOSFET is later formed. Then, only the P-type gate region 6(b) is implanted with B (boron) ions at an acceleration voltage of 5 keV and a dose of $2.5 \times 10^{15}$ ions/cm² by ion implantation to convert the non-doped polysilicon film 1 in the P-type gate region 6(b) into a P-doped polysilicon 8(b) doped with the P-type impurity (FIG. 1(c)).

On the N-doped polysilicon 8(a) doped with the N-type impurity and the P-doped polysilicon 8(b) doped with the P-type impurity is formed a 5-nm tungsten silicide ($WSi_2$) film 2 by CVD as a buffer layer for preventing increase in interface resistance. Then, thermal treatment is carried out at about 800° C. for about 30 seconds in a nitrogen atmosphere (FIG. 2). This thermal treatment serves both to activate the P (phosphorous) ions implanted in the N-type gate region 6(a) and the B (boron) ions implanted in the P-type gate region 6(b), as well as to remove residual impurities contained in the CVD raw material gas.

The tungsten silicide film formed may be alternatively formed, not by CVD, but by forming a tungsten (W) film on the N-doped polysilicon 8(a) and P-doped polysilicon 8(b) through sputtering and performing thermal treatment to induce reaction between the polysilicon and tungsten.

Then, on the tungsten silicide film 2 is formed a tungsten nitride film as a barrier layer, on which a tungsten film is formed. The resulting stacked film is processed into a desired pattern to form a gate electrode.

When the PN dual gate process is used to manufacture a semiconductor device as described above, variation in threshold value (Vt) may occur.

This variation in Vt is considered to be attributable to the following: In the polysilicon film, P (phosphorous), As (arsenic) or the like is implanted into the N-gate region as an N-type impurity while B (boron) or the like is implanted into the P-gate region as a P-type impurity. These impurities interdiffuse in the thermal treatment process to change the concentrations of the impurities. The Fermi position of the gate changes accordingly and hence the work function difference between the gate and the silicon substrate changes, resulting in the variation in Vt.

The mechanism of interdiffusion between the N-type and P-type impurities will be described with reference to FIG. 3.

The P-type impurity in the P-doped polysilicon film 8(b) in the P-type gate region 6(b) may diffuse into the N-doped polysilicon film 8(a) in the N-type gate region 6(a) through a path 11(a) in the tungsten silicide film 2, while the N-type impurity in the N-doped polysilicon film 8(a) in the N-type gate region 6(a) may diffuse into the P-doped polysilicon film 8(b) in the P-type gate region 6(b) through a path 11(b) in the tungsten silicide film 2, conceivably resulting in interdiffusion between the P-type and N-type impurities.

In such interdiffusion, impurities having opposite conductivity types diffuse into the counterpart regions, so that impurity concentrations vary in the polysilicon film and the work functions change accordingly, resulting in the variation in Vt.

SUMMARY OF THE INVENTION

An object of the present invention is to provide a method for manufacturing a semiconductor device with reduced variation in transistor properties.

According to the present invention, there are provided the following methods for manufacturing a semiconductor device:

(1) A method for manufacturing a semiconductor device with a P-type MOSFET and an N-type MOSFET, each comprising a gate electrode having a stacked structure in which a polysilicon film into which an impurity is introduced, a metal silicide film, a metal nitride film and a metal film are stacked on a gate insulating film in this order, the method comprising the steps of:

forming a gate insulating film of a semiconductor substrate;

forming a non-doped polysilicon film on the gate insulating film;

forming a metal silicide film on the non-doped polysilicon film;

forming a metal nitride film on the metal silicide film;

forming a metal film on the metal nitride film;

processing at least the metal film, the metal nitride film and the metal silicide film to pattern them into the shape of a gate such that the portion of the meal silicide film that forms part of a gate electrode of a P-type MOSFET and the portion of the meal silicide film that forms part of a gate electrode of an N-type MOSFET are separated from each other;

introducing a P-type impurity into the non-doped polysilicon film in the region where the P-type MOSFET is formed;

introducing an N-type impurity into the non-doped polysilicon film in the region where the N-type MOSFET is formed;

performing thermal treatment to diffuse the P-type and N-type impurities introduced in the polysilicon film; and patterning the polysilicon film with the impurities introduced into the shape of the gate to form the gate electrodes.

(2) The method for manufacturing a semiconductor device according to the item 1, wherein when the metal film, the metal nitride film and the metal silicide film are processed, the upper portion of the non-doped polysilicon film is also processed and patterned into the shape of a gate.

(3) A method for manufacturing a semiconductor device with a P-type MOSFET and an N-type MOSFET, each comprising a gate electrode having a stacked structure in which a polysilicon film into which an impurity is introduced, a metal silicide film, a metal nitride film and a metal film are stacked on a gate insulating film in this order, the method comprising the steps of:

forming a gate insulating film of a semiconductor substrate;

forming a non-doped polysilicon film on the gate insulating film;

forming a metal silicide film on the non-doped polysilicon film;

forming a metal nitride film on the metal silicide film;

forming a metal film on the metal nitride film;

patterning the metal film, the metal nitride film, the metal silicide film and the upper portion of the non-doped polysilicon film into the shape of a gate;

introducing a P-type impurity into the non-doped polysilicon film in the region where a P-type MOSFET is formed;

introducing an N-type impurity into the non-doped polysilicon film in the region where an N-type MOSFET is formed;

performing thermal treatment to diffuse the P-type and N-type impurities introduced in the polysilicon film; and patterning the polysilicon film with the impurities introduced into the shape of the gate to form the gate electrodes.

(4) The method for manufacturing a semiconductor device according to any of the items 1 to 3, wherein the introduction of the P-type and N-type impurities are carried out by ion implantation.

(5) The method for manufacturing a semiconductor device according to the item 4, wherein the introduction of the P-type and N-type impurities are carried out by oblique ion implantation.

(6) The method for manufacturing a semiconductor device according to the item 4, wherein the introduction of the P-type impurity is carried out by oblique ion implantation while the region where the N-type MOSFET is formed is masked, so that the P-type impurity is introduced into the portion of the polysilicon film that forms part of the gate electrode of the P-type MOSFET, the introduction of the N-type impurity is carried out by oblique ion implantation while the region where the P-type MOSFET is formed is masked, so that the N-type impurity is introduced into the portion of the polysilicon film that forms part of the gate electrode of the N-type MOSFET, and the thermal treatment diffuses the impurities throughout the portions of the polysilicon film that form part of the respective gate electrodes of the P-type MOSFET and the N-type MOSFET to achieve uniform concentration distribution of the impurities.

According to the present invention, in the polymetal gate formation step using the PN dual gate process, the polysilicon film contains no impurity during thermal treatment after the formation of the metal silicide film, so that no impurity interdiffuses therethrough.

Consequently, as there is no shift of the MOSFET Vt due to impurity interdiffusion, there is no variation in Vt, allowing reduced variation in transistor properties.

DETAILED DESCRIPTION OF THE PREFERRED EMBODIMENTS

Figure 1:
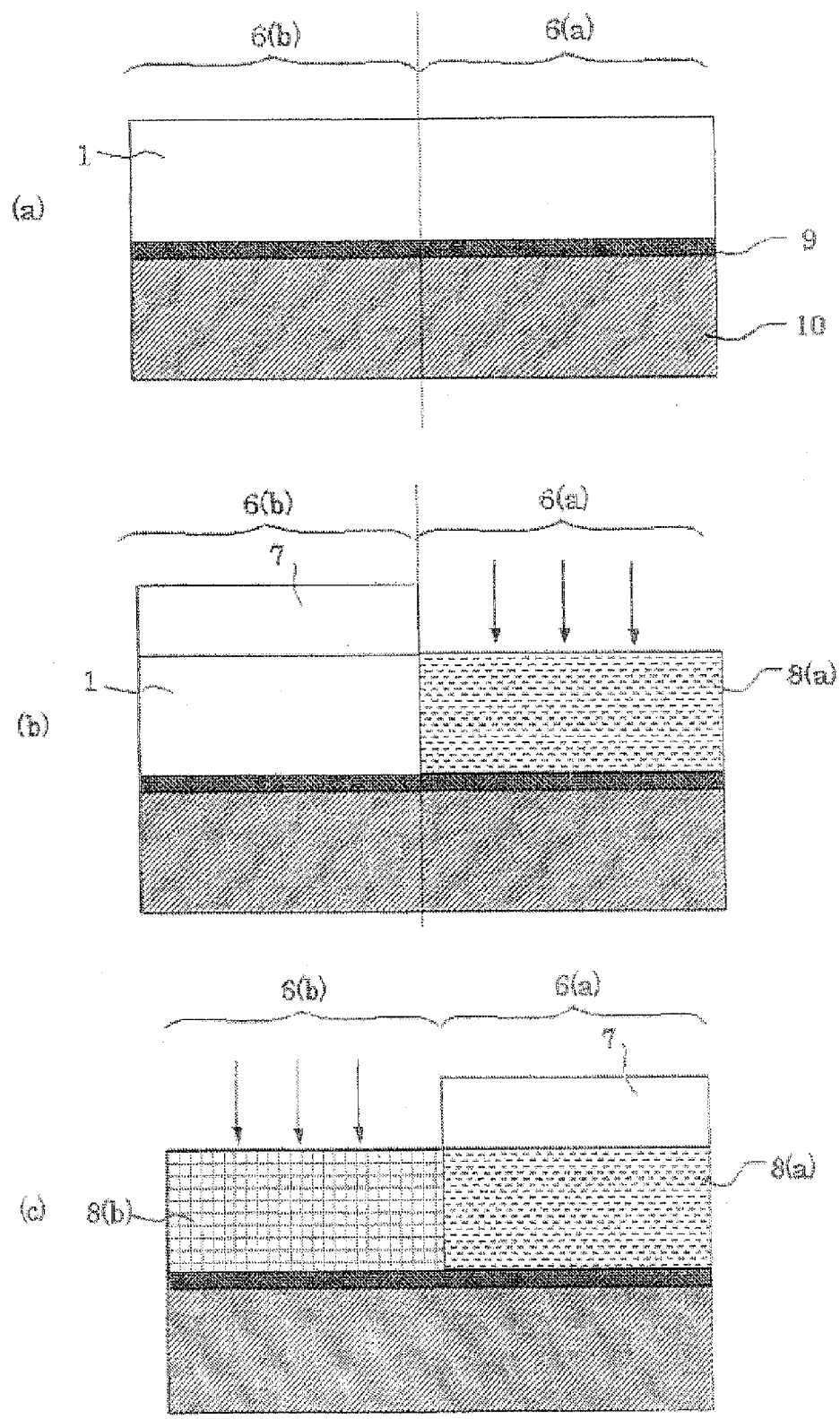
FIG. 1 is a diagrammatic process cross-sectional view showing a conventional method for manufacturing a semiconductor device (PN dual gate process)
Figure 2:
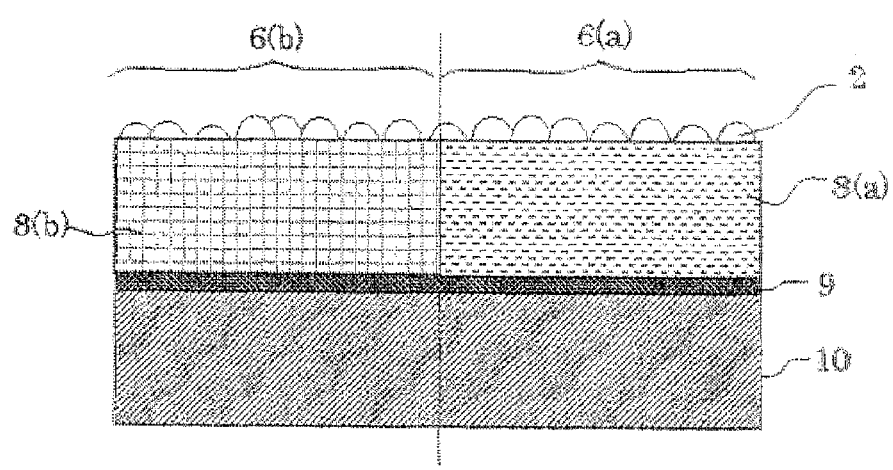
FIG. 2 is a diagrammatic process cross-sectional view showing the conventional method for manufacturing a semiconductor device (PN dual gate process)
Figure 3:
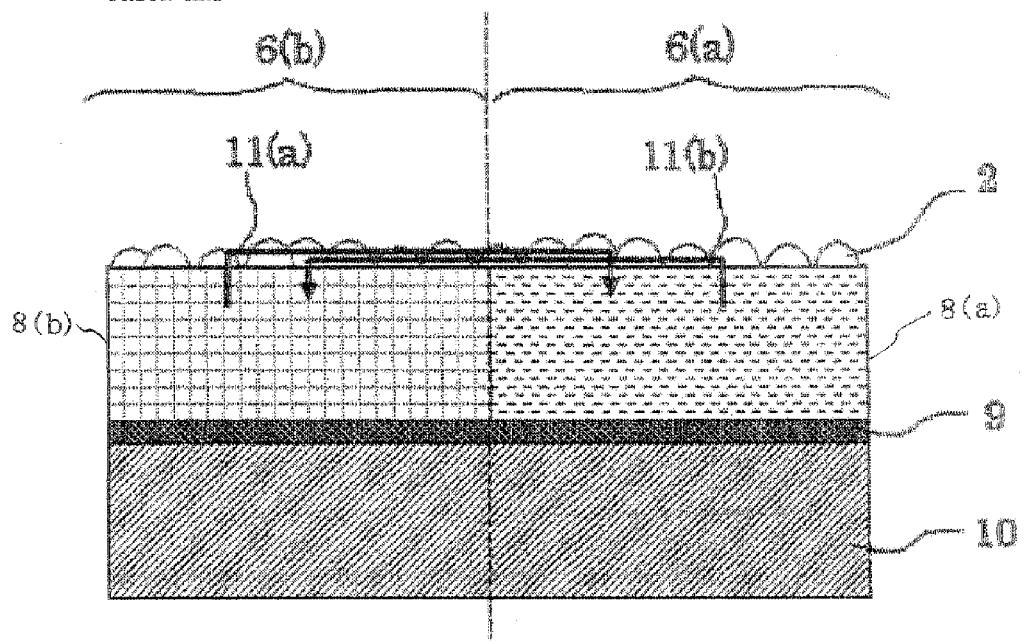
FIG. 3 is a diagrammatic cross-sectional view for explaining impurity interdiffusion.
Figure 4:
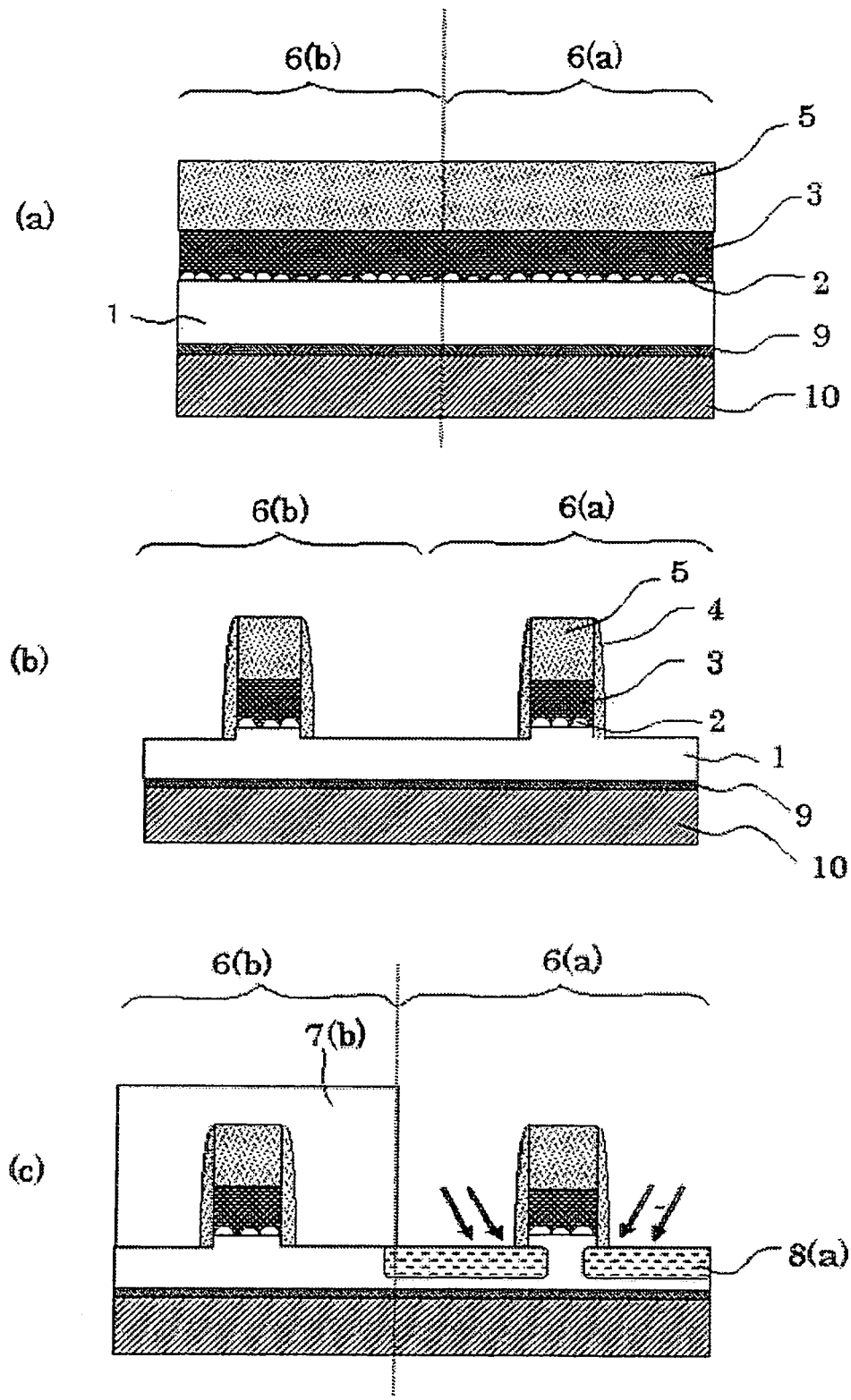
FIG. 4 is a diagrammatic process cross-sectional view showing a method for manufacturing a semiconductor device according to the present invention (PN dual gate process)
Figure 5:
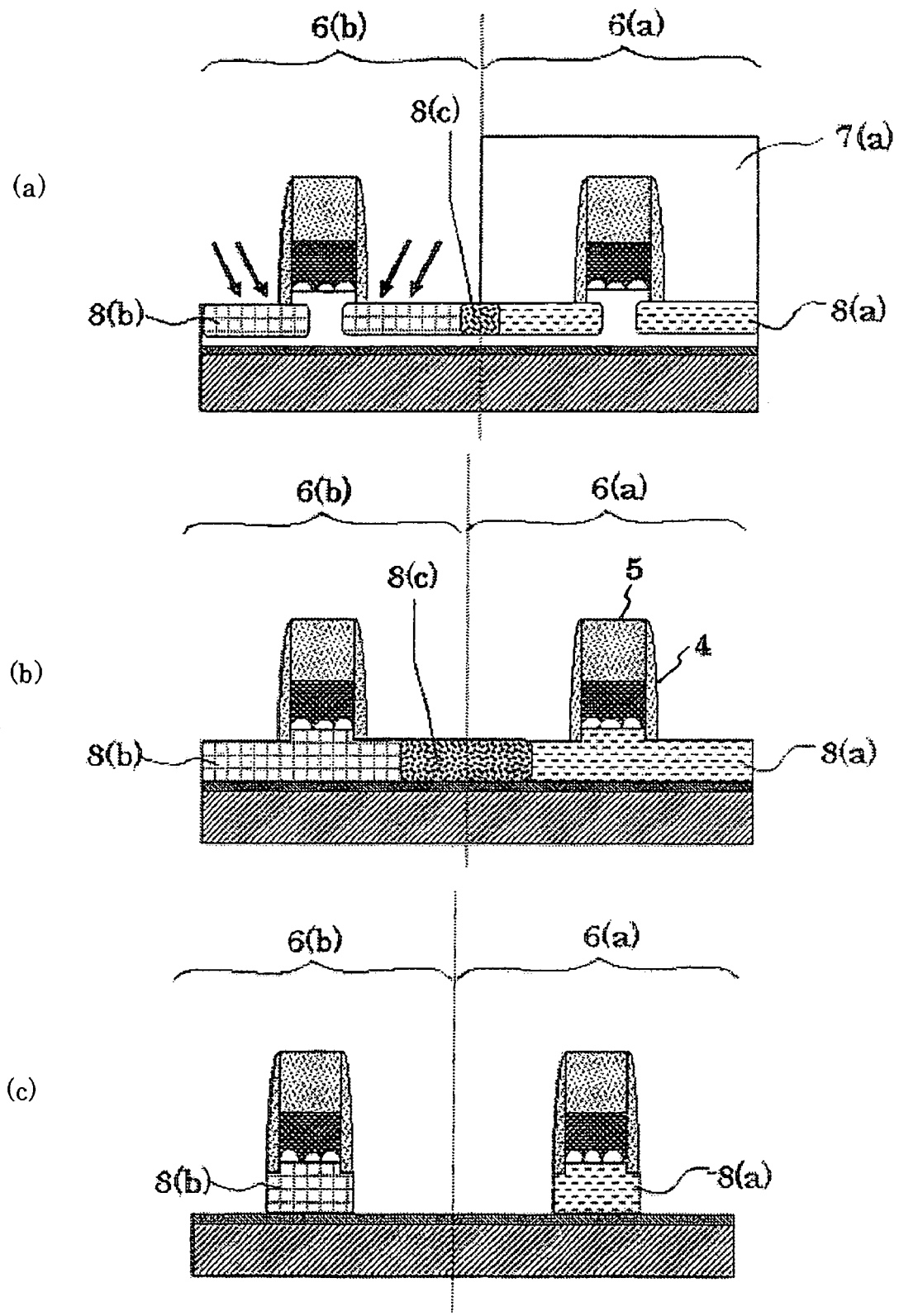
FIG. 5 is a diagrammatic process cross-sectional view showing the method for manufacturing a semiconductor device according to the present invention (PN dual gate process).

One embodiment of the present invention will be described in detail with reference to diagrammatic process cross-sectional views of FIGS. 4 and 5.

Firstly, thermal oxidation is used to form a gate insulating film 9 on a silicon substrate 10. The gate insulating film 9 is formed of a thermal oxide film with a film thickness of 5 nm, and this thickness may be set, for example, within a range of 3 nm to 6 nm as required.

As the gate insulating film 9, the silicon oxide film may be replaced with a silicon oxynitride film, which may be formed by using thermal oxidation to form an oxide film and then thermally treating the oxide film in a nitrogen atmosphere.

Then, a non-doped polysilicon film 1 with a film thickness of 70 nm is formed using typical LPCVD. The thickness may be set, for example, within a range of 50 nm to 100 nm as required in consideration of wiring resistance control, threshold value control, processability and the like.

Subsequently, a tungsten silicide ($WSi_2$) film 2 with a film thickness of 5 nm as a buffer layer is formed using CVD and thermally treated at 800° C. for 30 seconds for outgassing. The thickness of the buffer layer is preferably within a range of 2 nm to 10 nm, more preferably, within a range of 3 nm to 8 nm. If this thickness is too thin, the buffer layer cannot sufficiently exhibit its inherent function, while a too thick buffer layer increases gate wiring resistance.

Thereafter, a tungsten nitride ($WN_x$) film (barrier layer) with a film thickness of 10 nm and a tungsten (W) film (metal film) with a film thickness of 55 nm are sputtered to form a stacked film 3. In FIGS. 4 and 5, the boundary line between the tungsten nitride film and the tungsten film in the stacked film 3 is not shown.

Subsequently, a silicon nitride film 5 with a film thickness of 140 nm is formed using LPCVD (FIG. 4(a)).

The thickness of the barrier layer is preferably within a range of 2 nm to 20 nm, more preferably, within a range of 5 nm to 15 nm. If this thickness is too thin, the barrier layer cannot sufficiently exhibit its inherent function, while a too thick barrier layer increases gate wiring resistance.

The thickness of the metal film, such as the tungsten film, is preferably within a range of 20 nm to 100 nm, more preferably, within a range between 30 and 80 nm. If the thickness of the metal film is too thin, gate wiring resistance increases, while a too thick metal film reduces processability and productivity.

As the material of the buffer layer, tungsten silicide may be replaced with other metal silicides. Other metal silicides include titanium silicide, cobalt silicide and nickel silicide.

In the above description, although the stacked film formed of the tungsten nitride film and the tungsten film is shown as the stacked film 3 formed of the barrier layer and the metal film, a stacked film formed of a barrier layer made of some other metal nitride film and other metal film may be used. Other materials of the metal nitride film include titanium nitride, cobalt nitride and nickel nitride. Other materials of the metal film include titanium, cobalt and nickel.

In the above stacked structure formed of the buffer layer 2 and the stacked film 3, which is formed of the barrier layer and the metal film, each layer is preferably made of material including a same metal.

Then, a photoresist film (not shown) is formed on the silicon nitride film 5 and typical photolithography is used to form a photoresist pattern. Subsequently, the photoresist pattern is used as a mask to pattern the silicon nitride film 5 by dry etching, and then the photoresist pattern is removed.

Subsequently, the patterned silicon nitride film 5 is used as a mask to dry etch the stacked film 3 formed of the tungsten film and the tungsten nitride film as well as the tungsten silicide film ($WSi_2$) 2 into the shape of a gate pattern. In this process, the non-doped polysilicon film 1 is overetched by 10 nm. This overetching can completely separate the gate-forming portion of the tungsten silicide film 2 in the P-type gate region and the gate-forming portion of the tungsten silicide film 2 in the N-type gate region.

Thereafter, a silicon nitride film with a film thickness of 11 nm is formed on the silicon substrate 10 using LPCVD. Then, the silicon nitride film is etched back using anisotropic dry etching to leave silicon nitride films 4 on the sides of the gate electrodes, while the remainder of the silicon nitride film is removed (FIG. 4(b)).

The etching of the silicon nitride film 4 may be carried out after impurities are implanted into the non-doped polysilicon film 1, which will be described later. In this case, ion implantation through the silicon nitride film 4 allows a controlled impurity implantation depth.

Thereafter, a photoresist film (not shown) is formed on the silicon substrate 10 and typical photolithography is used to remove the photoresist film from the N-type gate region 6(a) to form a resist mask 7(b) with an aperture over the N-type gate region. Then, P (phosphorous) ions are implanted at an oblique angle of 15 degrees with respect to the direction perpendicular to the plane of the substrate (FIG. 4(c)) at an acceleration voltage of 10 keV and a dose of $6.0 \times 10^{15}$ ions/cm$^2$.

Although the ion implantation may be carried out at a normal angle to the substrate, the oblique ion implantation allows the impurity to be implanted into the portion of the polysilicon film that underlies the patterned stacked film 3 and buffer layer 2 so that the surface of that portion is not unexposed. Consequently, a uniform impurity distribution can be more easily obtained upon subsequent thermal treatment. The angle with respect to the substrate may be selected as required, depending on the width (in the channel length direction) of the region where the impurity cannot be introduced by the subsequent thermal treatment as well as the thickness of the non-doped polysilicon film 1.

Typically, the diffusion rate of an impurity in the direction parallel to the plane of the substrate is about 60% of the diffusion rate in the direction perpendicular to the plane of the substrate. Therefore, ions may be implanted in the direction perpendicular to the plane of the substrate when the gate length or channel length is similar to or less than the thickness of the non-doped polysilicon. On the other hand, when oblique ion implantation is used, optimization is possible according to a circuit pattern and design criterion. The oblique ion implantation is preferably carried out at an angle within a range of about 10 to 30 degrees with respect to the direction perpendicular to the plane of the substrate (FIG. 4(c)).

Upon removal of the resist mask 7(b), a photoresist film (not shown) is formed on the silicon substrate 10 and typical photolithography is used to remove the photoresist film from the P-type gate region 6(b) to form a resist mask 7(a) with an aperture over the P-type gate region. Then, B (boron) ions are implanted at an oblique angle of 15 degrees with respect to the direction perpendicular to the plane of the substrate (FIG. 5(a)) at an acceleration voltage of 5 keV and a dose of $2.5 \times 10^{15}$ ions/cm$^2$.

Upon removal of the resist mask 7(a), thermal treatment is carried out at 800° C. for 30 seconds to activate the impurities introduced in the non-doped polysilicon film 1 by ion implantation, as well as to achieve uniform distribution of the impurity concentrations in the film (FIG. 5(b)).

In the oblique ion implantation carried out as described above, when phosphorous ions are implanted into the non-doped polysilicon film in the N-type gate region 6(a), phosphorous ions are also implanted into the non-doped polysilicon film in the adjacent P-type gate region 6(b), as shown in FIG. 4(c). Similarly, when boron ions are implantation into the non-doped polysilicon film in the P-type gate region 6(b), boron ions are also implanted into the polysilicon film in the adjacent N-type gate region 6(a). As a result, a region 8(c) where the N-type and P-type impurities coexist is formed (FIG. 5(a)).

The thermal treatment expands the region 8(c) where the N-type and P-type impurities coexist, which is formed at the interface between the N-type gate region 6(a) and the adjacent P-type gate region 6(b), as shown in FIG. 5(b).

Even when the impurities are introduced in the direction perpendicular to the substrate by ion implantation, the region 8(c) where the N-type and P-type impurities coexist will be formed because the impurities diffuse in the thermal treatment for activating the impurities introduced by ion implantation.

On the other hand, the N-doped polysilicon region 8(a) formed in part of the polysilicon film in the N-type gate region 6(a) expands throughout the polysilicon film in the N-type gate region 6(a) by the thermal treatment. As a result, the impurity introduced in part of the N-type gate-forming polysilicon film (the portion underlying the patterned stacked film 3 and buffer layer 2) diffuses throughout the N-type gate-forming polysilicon film.

Also, the P-doped polysilicon region 8(b) formed in part of the polysilicon film in the P-type gate region 6(b) expands throughout the polysilicon film in the P-type gate region 6(b) by the thermal treatment. As a result, the impurity introduced in part of the P-type gate-forming polysilicon film (the portion underlying the patterned stacked film 3 and buffer layer 2) diffuses throughout the P-type gate-forming polysilicon film.

Upon the thermal treatment, the silicon nitride films 5 formed on the gate electrodes and the silicon nitride films 4 formed on the side walls of the gate electrodes are used as a mask to remove the polysilicon film 1 that is not covered by the mask by typical anisotropic dry etching (FIG. 5(c)).

Although the impurities introduced in the polysilicon film by ion implantation diffuse in the polysilicon film by the thermal treatment and the region 8(c) where the N-type and P-type impurities coexist is formed, the region 8(c) is removed in the etching process as described above. Therefore, the N-type and P-type gate electrodes can be formed without the P-type impurity diffused into the polysilicon film 8(a) of the N-type gate nor the N-type impurity diffused into the polysilicon film 8(b) of the P-type gate.

Thereafter, although not shown in the figure, source/drain regions and interlayer insulating films formed of silicon oxide films and the like are formed according to a typical method. Subsequently, contact holes are formed in the interlayer insulating films and filled with metal to form contact plugs that are connected to the source/drain regions and gate electrodes. After processes for forming wiring lines and the like, a semiconductor integrated circuit device is finally completed.

The silicon nitride films 4 and 5 in the above embodiment are not limited to silicon nitride films, but may be silicon oxynitride films or organic insulating films, as long as sufficient etching selectivity with respect to polysilicon is attained and sufficient etching selectivity with respect to the interlayer insulating film is attained when contact holes to the source/drain regions are formed in the interlayer insulating film.

What is claimed is:

1. A method for manufacturing a semiconductor device with a P-type MOSFET and an N-type MOSFET, each comprising a gate electrode having a stacked structure in which a polysilicon film into which an impurity is introduced, a metal silicide film, a metal nitride film and a metal film are stacked on a gate insulating film in this order, the method comprising the steps of:
   forming a gate insulating film on a semiconductor substrate;
   forming a non-doped polysilicon film on the gate insulating film;
   forming a metal silicide film on the non-doped polysilicon film;
   forming a metal nitride film on the metal silicide film;
   forming a metal film on the metal nitride film;
   processing at least the metal film, the metal nitride film and the metal silicide film to pattern them into the shape of a gate such that the portion of the metal silicide film that forms part of a gate electrode of a P-type MOSFET and the portion of the metal silicide film that forms part of a gate electrode of an N-type MOSFET are separated from each other;
   introducing a P-type impurity into the non-doped polysilicon film in the region where the P-type MOSFET is formed;
   introducing an N-type impurity into the non-doped polysilicon film in the region where the N-type MOSFET is formed;
   performing thermal treatment to diffuse the P-type and N-type impurities introduced in the polysilicon film; and
   patterning the polysilicon film with the impurities introduced into the shape of the gate to form the gate electrodes.

2. The method for manufacturing a semiconductor device according to claim 1, wherein when the metal film, the metal nitride film and the metal silicide film are processed, the upper portion of the non-doped polysilicon film is also processed and patterned into the shape of a gate.

3. The method for manufacturing a semiconductor device according to claim 1, wherein the introduction of the P-type and N-type impurities are carried out by ion implantation.

4. The method for manufacturing a semiconductor device according to claim 3, wherein the introduction of the P-type and N-type impurities are carried out by oblique ion implantation.

5. The method for manufacturing a semiconductor device according to claim 3, wherein
   the introduction of the P-type impurity is carried out by oblique ion implantation while the region where the N-type MOSFET is formed is masked, so that the P-type impurity is introduced into the portion of the polysilicon film that forms part of the gate electrode of the P-type MOSFET, the introduction of the N-type impurity is carried out by oblique ion implantation while the region where the P-type MOSFET is formed is masked, so that the N-type impurity is introduced into the portion of the polysilicon film that forms part of the gate electrode of the N-type MOSFET, and the thermal treatment diffuses the impurities throughout the portions of the polysilicon film that form part of the respective gate electrodes of the P-type MOSFET and the N-type MOSFET to achieve uniform concentration distribution of the impurities.

6. A method for manufacturing a semiconductor device with a P-type MOSFET and an N-type MOSFET, each comprising a gate electrode having a stacked structure in which a polysilicon film into which an impurity is introduced, a metal silicide film, a metal nitride film and a metal film are stacked on a gate insulating film in this order, the method comprising the steps of:

forming a gate insulating film on a semiconductor substrate;

forming a non-doped polysilicon film on the gate insulating film;

forming a metal silicide film on the non-doped polysilicon film;

forming a metal nitride film on the metal silicide film;

forming a metal film on the metal nitride film;

patterning the metal film, the metal nitride film, the metal silicide film and the upper portion of the non-doped polysilicon film into the shape of a gate;

introducing a P-type impurity into the non-doped polysilicon film in the region where a P-type MOSFET is formed;

introducing an N-type impurity into the non-doped polysilicon film in the region where an N-type MOSFET is formed;

performing thermal treatment to diffuse the P-type and N-type impurities introduced in the polysilicon film; and patterning the polysilicon film with the impurities introduced into the shape of the gate to form the gate electrodes.

* * * * *